United States Patent
Teng

(10) Patent No.: US 7,913,620 B2
(45) Date of Patent: Mar. 29, 2011

(54) METHOD OF ON-PRESS DEVELOPING OVERCOATED LITHOGRAPHIC PRINTING PLATE

(76) Inventor: Gary Ganghui Teng, Northborough, MA (US)

( * ) Notice: Subject to any disclaimer, the term of this patent is extended or adjusted under 35 U.S.C. 154(b) by 503 days.

(21) Appl. No.: 12/041,657

(22) Filed: Mar. 3, 2008

(65) Prior Publication Data

US 2009/0220891 A1    Sep. 3, 2009

(51) Int. Cl.
*G03F 7/00* (2006.01)
*G03F 7/26* (2006.01)

(52) U.S. Cl. .................. 101/450.1; 430/302; 430/303

(58) Field of Classification Search .............. 430/302; 101/450.1
See application file for complete search history.

(56) References Cited

U.S. PATENT DOCUMENTS

| | | | |
|---|---|---|---|
| 5,599,650 A | 2/1997 | Bi et al. | 430/273.1 |
| 5,677,110 A | 10/1997 | Chia et al. | 430/302 |
| 6,387,595 B1 * | 5/2002 | Teng | 430/302 |
| 6,482,571 B1 | 11/2002 | Teng | 430/302 |
| 6,541,183 B2 | 4/2003 | Teng | 430/303 |
| 6,689,537 B2 | 2/2004 | Urano et al. | 430/273.1 |
| 6,740,464 B2 | 5/2004 | Maemoto | 430/138 |
| 7,213,516 B1 * | 5/2007 | Teng | 101/451 |
| 7,297,467 B2 | 11/2007 | Vander Aa | 430/302 |
| 2003/0186165 A1 | 10/2003 | Gries et al. | 430/281.1 |
| 2003/0228540 A1 * | 12/2003 | Goto et al. | 430/272.1 |
| 2005/0112502 A1 * | 5/2005 | Teng | 430/302 |
| 2007/0009829 A1 * | 1/2007 | Teng | 430/270.1 |
| 2008/0008957 A1 | 1/2008 | Munnelly et al. | 430/270.1 |

* cited by examiner

*Primary Examiner* — Cynthia H Kelly
*Assistant Examiner* — Chanceity N Robinson

(57) ABSTRACT

A method of processing an on-press developable lithographic printing plate involving the removal of overcoat after imagewise exposure and before on-press development is described. The plate comprises a substrate, an on-press ink and/or fountain solution developable photosensitive layer, and an overcoat. The laser imaged plate is stripped off the overcoat, and then under a white room light mounted on press and developed with ink and/or fountain solution. Here the plate is capable of hardening upon exposure to a laser, has limited white light stability before the removal of the overcoat, and has significantly improved white light stability after the removal of the overcoat.

19 Claims, No Drawings

METHOD OF ON-PRESS DEVELOPING OVERCOATED LITHOGRAPHIC PRINTING PLATE

FIELD OF THE INVENTION

This invention relates to lithographic printing plate. More particularly, it relates to a method of on-press developing a lithographic plate involving the removal of overcoat before mounting on press.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. Conventionally, the plate is exposed with an ultraviolet light from a lamp through a separate photomask film having predetermined imaging pattern that is placed between the light source and the plate, and the exposed plate is developed with a liquid developer to bare the substrate in the non-hardened or solubilized areas.

Laser sources have been increasingly used to imagewise expose a printing plate that is sensitized to a corresponding laser wavelength, allowing the elimination of the photomask film. Suitable lasers include, for example, infrared lasers (such as laser diode of about 830 nm and NdYAG laser of about 1064 nm), visible lasers (such as frequency-doubled NdYAG laser of about 532 nm and violet laser diode of about 405 nm), and ultraviolet laser (such as ultraviolet laser diode of about 370 nm).

Laser sensitive plates generally have higher sensitivity (than conventional plates) because of the limited laser power and the desire for fast imaging speed. Accordingly, photosensitive plates designed for laser imaging generally have limited room light stability. For example, before being developed to remove the non-hardened areas, frequency-doubled NdYAG laser sensitive plates usually require red room light for handling, violet laser sensitive plates usually require orange or yellow room light for handling, and infrared laser sensitive photopolymer plates usually require yellow room light for handling and have only limited white light stability (due to, for example, the use of certain initiator which has spectral sensitivity in the ultraviolet region).

On-press developable lithographic printing plates have been disclosed in the literature. Such plates can be directly mounted on press after imagewise exposure to develop with ink and/or fountain solution during the initial prints and then to print out regular printed sheets. No separate development process before mounting on press is needed, allowing the reduction of labor and the elimination of hazardous waste. Among the patents describing on-press developable lithographic printing plates are U.S. Pat. Nos. 5,258,263, 5,516, 620, 5,561,029, 5,616,449, 5,677,110, 5,811,220, 6,014,929, 6,071,675, and 6,482,571.

An on-press developable plate is designed to be developed on a lithographic printing press in a pressroom, which is generally under regular office light (white room light). The imagewise exposed plate typically sees the white room light during the handling and on-press development. Therefore, the plate must be designed so that it is stable enough under regular office light within a certain time period (such as 30 minutes), and yet has sufficient photospeed suitable for imaging with available commercial imagers. However, a plate with faster photospeed generally has shorter handling window under white room light, while a plate with longer handling window under white room light generally has slower photospeed. Therefore, it is very difficult to design a laser sensitive on-press developable plate having both fast enough photospeed and wide enough handling window (in terms of time) under white room light.

It would be desirable if a laser sensitive on-press developable lithographic plate and/or method of using it can be designed so that the plate has sufficient photospeed during laser exposure and the laser exposed plate can be handled freely under white room light before and during on-press development.

The inventor has found that such a desire can be achieved by a method of removing the overcoat of a specific overcoated lithographic plate after imagewise exposing said plate and before mounting said plate on press for development with ink and/or fountain solution. Here said plate is capable of hardening upon exposure to a laser and has limited white room light stability before the removal of the overcoat, and has significantly improved white room light stability after the removal of the overcoat.

SUMMARY OF THE INVENTION

According to the present invention, there has been provided a method of lithographically printing images on a receiving medium, comprising in order:

(a) providing a lithographic plate comprising (i) a substrate, (ii) a photosensitive layer, and (iii) an overcoat; said photosensitive layer being soluble or dispersible in ink and/or fountain solution and capable of hardening upon exposure to a laser having a wavelength selected from 200 to 1200 nm;

(b) imagewise exposing said plate with said laser to cause hardening of said photosensitive layer in the exposed areas;

(c) removing said overcoat from said plate;

(d) mounting said plate onto a lithographic press; and (e) contacting said plate with ink and/or fountain solution on said lithographic press to remove the photosensitive layer in the non-hardened areas and to lithographically print images from said plate to the receiving medium;

(f) wherein said mounting and on-press development (steps d and e) are performed with the plate under a white room light, said photosensitive layer before the removal of the overcoat is capable of hardening or causing background toning under said room light for less than a time period selected from 1 to 60 minutes, and said photosensitive layer after the removal of the overcoat is incapable of hardening or causing background toning under said room light for at least twice of said time period.

The plate is imagewise exposed with a laser on a laser imager, stripped off the overcoat, and then mounted on press for development with ink and/or fountain solution and lithographic printing, with the plate being under a white room light during the mounting and on-press development as well as lithographic printing. The plate has limited white room light stability before removing the overcoat and has significantly improved white room light stability after removing the overcoat. While the presence of the overcoat during laser imaging allows sufficiently fast photospeed, the overcoat removal of the laser exposed plate allows wider window (in terms of time) for handling the plate under while room light during and right before on-press development. The overcoat-removed plate is preferably inspected by the operator under white room light before mounting on press for development with ink and/or fountain solution.

Preferably, said photosensitive layer before the removal of the overcoat is capable of hardening or causing background toning under said white room light for less than 60 minutes (more preferably less than 30 minutes, even more preferably less than 10 minutes, and most preferably less than 1 minute), and said photosensitive layer after the removal of the overcoat is incapable of hardening or causing background toning under said white room light for at least 120 minutes (more preferably at least 300 minutes and most preferably any amount of time). Here the background toning (which is the presence of unclean or slightly inked non-imaging areas for a developed plate on press) is caused by partial hardening of the photosensitive layer after exposure to said white room light for certain amount of time.

The overcoat can be removed by any means, preferably by mechanical peeling or by rinsing with water or an aqueous solution. For overcoat insoluble or non-dispersible in water or an aqueous solution, the overcoat is preferably removed by peeling. For plate rinsed with water or an aqueous solution, the overcoat is soluble or dispersible in water or an aqueous solution, preferably soluble in water. The plate rinsed with water or an aqueous solution to remove the overcoat is preferably further dried with forced air and/or heat (preferably forced hot air) to dry off any wet-looking liquid layer on the plate surface before mounting on press.

The photosensitive layer is negative-working, capable of hardening upon exposure to a laser having a wavelength selected from 200 to 1200 nm, preferably an infrared laser of from 750 to 1200 nm or a violet or ultraviolet laser of from 200 to 430 nm. A preferred photosensitive layer comprises a polymeric binder, a free radical polymerizable monomer, a free radical initiator, and a sensitizing dye.

The laser exposure and overcoat removal (steps b to c) can be performed with the plate under a yellow or red light (such as in a room with yellow or red light), in darkness or substantial darkness (such as with the plate in an imager having light-tight covers and then in an overcoat removal device having light-tight covers), or under white room light for limited time, depending on the white light sensitivity of the plate. Preferably, the laser exposure and overcoat removal are performed with the plate under a yellow or red light, or in darkness or substantial darkness. The overcoat removal (step c) is preferably performed on an overcoat removal device that is connected to or is part of an imaging device for the laser exposure (step b).

DETAILED DESCRIPTION OF THE PREFERRED EMBODIMENTS

The lithographic plate of this invention comprises on a substrate a photosensitive layer and an overcoat. The overcoat is capable of being removed prior to mounting the plate on press for development with ink and/or fountain solution and lithographic printing. The overcoat is preferably removed by mechanical peeling or by rinsing with water or an aqueous solution. The overcoat preferably has a coverage of at least 0.1 g/m$^2$, more preferably from 0.5 to 10 g/m$^2$, even more preferably from 1.0 to 7 g/m$^2$, and more preferably from 2.0 to 5.0 g/m$^2$.

The overcoat can be any film-forming material which is substantially transparent to the imaging laser and is capable of being removed by mechanical peeling or by rinse with water or an aqueous solution. The overcoat can be formed on the plate by coating from a solution or dispersion or by laminating from a polymeric film, preferably by coating from a solution or dispersion containing a film-forming polymer, more preferably by coating from an aqueous solution or dispersion containing a film-forming polymer. Here the overcoat removable by rinsing with water or an aqueous solution must be soluble or dispersible in water or an aqueous solution, either said overcoat being formed by coating from a solution or dispersion or by lamination from a polymeric film. The coating can be performed by any known method, such as roller coating, slot coating, curtain coating, Mayer rod coating, dip coating, or spray coating; preferably roller coating or slot coating. The coated overcoat is further dried to remove the water as well as any solvent, preferably by forced hot air drying, radiation drying, or combination of forced air drying and radiation drying.

The solution or dispersion containing a film-forming polymer suitable for forming overcoat can be a water soluble polymer solution (containing water soluble polymer) or polymer dispersion (including polymer emulsion and latex, containing water-insoluble polymer, with or without addition of water soluble polymer), preferably a water soluble polymer solution. A suitable water soluble polymer overcoat comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) can also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic micro particles may be added into the overcoat to, for example, reduce the tackiness or moisture sensitivity of the plate.

The polymeric film suitable for laminating onto the photosensitive layer to form the overcoat can be any polymeric film, such as polymer films based on polyester (including polyethylene terephthalate), polyethylene, polypropylene, ethylene/propylene copolymer, polystyrene, polyvinyl butyrol, polynitrile, polyamide, polyimide, polyvinyl chloride, polycarbonate, polymethylmethacrylate, acrylate/styrene copolymer, methacrylate/styrene copolymer, polyurethane, epoxy-amine polymer, nylon, Teflon, cellulose and its film-forming derivatives, polyvinyl acetate, and polyvinyl alcohol. Polyester, polyethylene, and polypropylene are preferred polymeric film; and polyester is more preferred. An overcoat formed from a film that is insoluble and non-dispersible in water or an aqueous solution is suitable for removal by mechanical peeling, but not suitable for removal by rinsing with water or an aqueous solution.

The polymeric film can be directly laminated onto the photosensitive layer of a plate. Alternatively, the polymeric film can be pre-coated with a layer of adhesive before laminating onto the photosensitive layer of a plate (with the adhesive layer facing the photosensitive layer). Here the adhesive layer can be made of any adhesive material; preferably a pressure sensitive adhesive, a heat sensitive adhesive, a radiation-sensitive adhesive, or a moisture sensitive adhesive; more preferably a pressure sensitive adhesive. Preferably, the polymeric film is pre-coated with a layer of adhesive (more preferably a pressure sensitive adhesive) before laminating onto the photosensitive layer of the plate. The adhesive layer preferably has stronger adhesion to the film than to the photosensitive layer so that such adhesive layer comes off with the film during mechanical peeling.

The polymeric film can be laminated onto the photosensitive layer of a plate by any means, preferably by a pair of laminating rollers, with the plate at room temperature or at elevated temperature, preferably at elevated temperature. When laminating the polymeric film to the photosensitive layer of the plate at an elevated temperature, a pair of heated laminating rollers is preferably used.

For plate suitable for removing the overcoat by mechanical peeling, the overcoat can be peeled off as one or more large sheets, or as many small pieces. The overcoat can be peeled off from the plate by any means. The peeled away overcoat can be substantially free of any photosensitive layer, or can be attached with some of the photosensitive layer (i.e., part of the photosensitive layer, especially in the non-hardened areas, may be carried away with the overcoat). The mechanical peeling of the overcoat can be performed at room temperature or an elevated temperature, preferably at room temperature. The overcoat can either be soluble or dispersible in water or be insoluble and non-dispersible in water. In the manufacture of the original plate, the overcoat can be coated onto the photosensitive layer from a solution or dispersion, preferably an aqueous solution, or can be laminated onto the photosensitive layer from a film, preferably a polymeric film.

The overcoat suitable for being peeled off as one or more large sheets is preferably strong enough so that the overcoat can be peeled off as one or more thin films, more preferably one thin film. Preferably, it is peeled off by pulling with mechanical device or by hand from one end, preferably by a mechanical device. The mechanical device can be clamped to the overcoat at one end, adhered to the overcoat surface, or sucked by vacuum on the overcoat surface.

The overcoat suitable for being peeled off as many small pieces is preferably capable of being broken apart by mechanical scratching, rubbing or brushing, or by air blowing or vacuum suction. Preferably, the overcoat on the plate is brushed with a brush which is capable of breaking apart and peeling off the overcoat without damaging the photosensitive layer in the hardened areas. The peeled off overcoat pieces can be removed from the plate by vacuum suction, air blowing, brushing, rubber blade wiping, or other mechanical action, preferably by vacuum suction. The peeled off overcoat pieces can be collected in a waste vacuum bag or a container.

For plate suitable for removing the overcoat by rinsing with water or an aqueous solution, the overcoat is soluble or dispersible in water or an aqueous solution. The overcoat can be removed by contacting with water or an aqueous solution, with or without brushing or other rubbing action (by a brush, cloth, roller, or the like) or agitation (by stirring, vibrating, ultrasonifying, spraying with, or flushing with the water or aqueous solution). The water or aqueous solution can be applied to the plate by any means, such as by passing the plate through a bath containing rinsing water or aqueous solution or by spraying or pouring the water or aqueous solution to the plate which passes through. The plate rinsed with water or an aqueous solution can be further dried to dry off the plate surface, preferably by forced hot air.

While a plate is generally designed for overcoat removal with one of the methods, such as mechanical peeling or rinsing with water or an aqueous solution, the plate can also be designed in a way so that it is capable of removing the overcoat by both mechanical peeling and rinsing with water or an aqueous solution. Such a plate should have an overcoat which is soluble or dispersible in water or an aqueous solution and is also capable of being peeled off mechanically.

For plate suitable for removing the overcoat by rinsing with water or an aqueous solution, either water or an aqueous solution can be used, depending on the particular overcoat as well as the plate. Preferably, an aqueous solution which is capable of improving certain performance characteristics of the plate is used. More preferably, the aqueous solution is capable of improving the hydrophilicity of the substrate. The water or aqueous solution can be at room temperature or an elevated temperature, preferably at room temperature.

The water can be any water, such as tap water and deionized water, preferably tap water. The water after rinse may be reused for rinsing additional plates. The reused water may be filtered to remove any solid debris.

The aqueous solution can be any water-based solution capable of removing the overcoat without causing any adverse effect to the plate. Preferably, the aqueous solution is capable of improving certain performance of the plate, in addition to removing the overcoat to improve the white room light stability, such as improving the hydrophilicity of the substrate, forming or enhancing the visible images of the laser exposed plate, improving the developability of the plate, and/or further improving the white light stability of the photosensitive layer in the non-hardened areas. In other words, such an aqueous solution is preferably also a deactivating solution capable of deactivating the photosensitive layer, a discoloring solution capable of changing the color of the photosensitive layer primarily or only in the non-hardened areas, a hydrophilizing solution capable of enhancing the hydrophilicity of the substrate, and/or a development enhancing solution capable of increasing the on-press developability with ink and/or fountain solution. More preferably, the aqueous solution is a water-based solution comprising a deactivating agent, a discoloring agent, a hydrophilizing agent, or a development enhancer.

The aqueous solution preferably comprises at least 50% by weight of water, most preferably at least 80% by weight of water. One or more water-soluble organic solvents, such as ethylene glycol, can be added into the aqueous solution. Certain additives, such as dye, dispersed pigment, bactericide, stabilizer, reducer, thickening agent, and surfactant, can be added.

The deactivating agent can be any material that can deactivate the photo hardening capability of the photosensitive layer in the non-hardened areas, so that the non-hardened photosensitive layer (which is originally capable of hardening under a room light) becomes incapable or having reduced rate (preferably incapable) of hardening under such room light. The deactivating agent can be a solid, liquid, or gas; preferably a liquid or solid. Either organic or inorganic compound can be used as deactivating agent, such as organic or inorganic acid, base, oxidizer, reducer, or inhibitor. Various deactivating agents have been described in U.S. Pat. No. 7,213,516, and U.S. patent application Ser. Nos. 11/356,911, 11/728,648, 11/787,878, and 11/800,634; the entire disclosures of which are hereby incorporated by reference. The deactivating agent is preferably soluble in water and is applied from an aqueous solution. Various additives, such as surfactant, stabilizer, bactericide, defoamer, dye, cosolvent, pigment, and thickener can be added in the discoloring solution. The concentration of the deactivating agent in a deactivating solution is from 0.01 to 70%, more preferably from 0.1 to 30%, and most preferably from 1 to 10% by weight of the solution.

For free radical polymerizable photosensitive layer, the deactivating agent can be a compound that can react with a component of the free radical initiating system (such as initiator, sensitizing dye, hydrogen donor, or monomer; preferably the initiator, sensitizing dye, or hydrogen donor). For cationic polymerizable photosensitive layer, the deactivating agent can be a compound that can react with a component of the cationic polymerization system (such as the initiator which is an acid generator, sensitizing dye, or monomer; preferably the initiator or sensitizing dye).

For polymerizable photosensitive layer having an amine group or other acid-reacting group (a group capable of reacting with an acid) in the initiator, sensitizing dye, or hydrogen donor, an acid compound (including organic acid and inorganic acid) can be used as the deactivating agent. Suitable organic acids include, for example, organic compounds having at lease one carboxylic acid group, sulfonic acid group, or phosphonic acid group. Suitable inorganic acids include, for example, phosphoric acid, boric acid, and hydrochloride acid. Preferred acids are those with moderate acidity, such as organic compounds with at least one carboxylic acid group, phosphoric acid, polyvinyl phosphonic acid, and boric acid. More preferred are water soluble organic acids. Most preferred are water-soluble organic compounds having at least one carboxylic acid group. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment. The acid is preferably applied as an aqueous solution to deactivate the photosensitive layer. When strong acid (such as hydrochloric acid) is used as deactivating agent, it is preferably diluted to low concentration (such as less than 0.5%, preferably less than 0.1% by weight) in an aqueous solution to apply to the plate so that it does not damage the plate or cause safety problem. The acidic deactivating solution preferably has a pH of from 0.1 to 6.5, more preferably from 0.5 to 5.0, and most preferably from 1.0 to 4.0. The acidic deactivating solution preferably has a concentration of from 0.01 to 70%, and more preferably from 0.05 to 30% by weight of the solution. The aqueous acidic deactivating solution based on an organic acid preferably has a concentration of from 0.1 to 70%, more preferably from 0.5 to 30%, and most preferably from 2 to 10% by weight of the solution.

An alkaline compound can also be used as the deactivating agent for certain negative plates with free radical or cationic polymerizable or other acid crosslinkable photosensitive layers because it can react with certain free radical initiating system (such as initiator, sensitizing dye, or hydrogen donor), certain cationic initiating system (such as initiator which is an acid generator, or sensitizing dye), and other acid crosslinkable systems (such as negative-working diazonaphthoquinone systems). For example, an alkaline compound can react with an ionic initiator such as an onium salt, an ionic sensitizing dye such as a cyanine dye, or a hydrogen donor having carboxylic acid or thiol group; and can also neutralize with a cationic initiator which is an acid generator. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. More preferred amines are organic amines, including polymeric amines. Suitable water-soluble amines include regular amine compounds such as triethylamine, triethanolamine, 2-amino-2-methyl-1-propanol, tris(hydroxymethyl) aminomethane and N-methyl-2-pyrrolidone, and polymeric amines such as polyethyleneamine. The alkaline compound is preferably applied as an aqueous solution to deactivate the photosensitive layer. When strong base (such as sodium hydroxide) is used as deactivating agent, it is preferably diluted to low concentration (such as less than 0.5%, preferably less than 0.1% by weight) in an aqueous solution so that it does not damage the plate or cause safety problem. The alkaline deactivating solution preferably has a pH of from 7.5 to 13.5, more preferably from 8.0 to 12.0, and most preferably from 9.0 to 11.0. The alkaline deactivating solution preferably has a concentration of from 0.01 to 70%, and more preferably from 0.05 to 30% by weight of the solution. The aqueous alkaline deactivating solution based on organic amine preferably has a concentration of from 0.1 to 70%, more preferably from 0.5 to 30%, and most preferably from 2 to 10% by weight of the solution.

A free radical inhibitor can be used as the deactivating agent for plates with a free radical polymerizable photosensitive layer. Examples of suitable free radical inhibitors include methoxyhydroquinone, hydroquinone, 2,6-di-tert-butyl-4-methylphenol, polyvinylphenol, other compounds with at least one phenol group, and various commercial free radical stabilizer. Preferably, the inhibitor is dissolved in water or a water-solvent mixture (containing water and a water soluble organic solvent) to form an aqueous deactivating solution for applying to the plate. The deactivating solution based on a free radical inhibitor preferably has a concentration of from 0.1 to 70%, more preferably from 0.5 to 30%, and most preferably from 2 to 10% by weight of the solution.

The discoloring agent suitable for this invention can be any material that is capable of changing the color of the photosensitive layer primarily or only in the non-hardened areas, with less or no color change in the hardened areas. Preferably, the discoloring agent suitable for this invention is a material that is capable of reacting with a dye or latent dye in the photosensitive layer to cause color change (including turning on or turning off of color). The discoloring agent is preferably soluble in water and is dissolved in water to form an aqueous discoloring solution. The discoloring agent can be a solid, liquid, or gas: preferably a liquid or solid. Various additives, such as surfactant, stabilizer, bactericide, defoamer, dye, cosolvent, pigment, and thickener can be added in the discoloring solution. Depending on the photosensitive layer as well as its dye or pigment system, the discoloring agent can be different.

The discoloring solution is capable of diffusing into the non-hardened areas more efficiently than into the hardened areas, the application of such discoloring solution causes color change primarily or only in the non-hardened areas, with less or no color change in the hardened areas. Here, the term "the discoloring solution is capable of diffusing into the non-hardened areas of the photosensitive layer more efficiently than into the hardened areas" means that more discoloring solution can diffuse into the non-hardened areas of the photosensitive layer while less or no discoloring solution can diffuse into the hardened areas of the photosensitive layer.

For photosensitive layer comprising a visible dye capable of discoloration, the discoloring agent can be any compound capable of discoloring the dye. The application of the discoloring agent from a discoloring solution changes the color of the dye primarily or only in the non-hardened areas, with less or no color change in the hardened areas. Preferably, the color change is color reduction. For example, an imagewise exposed photosensitive layer comprising a crystal violet can be discolored with a hydrochloric acid aqueous solution to reduce the blue color in the non-exposed areas, with the hardened areas remaining substantially the original blue color.

For photosensitive layer comprising a latent dye, the discoloring agent can be any compound capable of turning on the color of the latent dye. The application of said discoloring agent from a discoloring solution partially or completely turns on the color of the latent dye primarily or only in the non-hardened areas, with less or no color change in the hardened areas. Examples of such system include a photosensitive layer having an acid sensitive latent dye and a discoloring agent which is an acid in an aqueous solution, and the application of such acid solution to the imagewise exposed plate turns on the color primarily or only in the non-hardened areas, with less or no color turning on in the hardened areas. Various latent dyes can be used, such as leuco crystal violet, leucomalachite green, azobenzene, 4-phenylazodiphenylamine, and methylene blue dyes.

For photosensitive layer having a visible dye capable of changing color (preferably turning off color) or a latent dye capable of turning on color upon contact with an acid, an acid aqueous solution can be used as the discoloring solution. The acid can be an organic acid or inorganic acid. Suitable organic acids include, for example, organic compounds having at lease one carboxylic acid group, a sulfonic acid group, or phosphonic acid group. Suitable inorganic acids include, for example, phosphoric acid, boric acid, and hydrochloride acid. Preferred acids are those with moderate acidity, such as organic compounds with at least one carboxylic acid group, phosphoric acid, polyvinyl phosphonic acid, and boric acid. More preferred are water soluble organic acids. Most preferred are water-soluble organic compounds having at least one carboxylic acid group. Solid acid (such as citric acid) is particular useful because it does not evaporate from the photosensitive layer. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment. The acid is preferably applied as an aqueous solution to discolor the photosensitive layer. When strong acid (such as hydrochloric acid) is used as discoloring agent, it is preferably diluted to low concentration (such as less than 0.5%, preferably less than 0.1% by weight) in an aqueous solution to apply to the plate so that it does not damage the plate or cause safety problem. The acidic discoloring solution preferably has a pH of from 0.1 to 6, more preferably from 0.5 to 4.0, and most preferably from 1.0 to 3.0. The acidic discoloring solution preferably has a concentration of from 0.01 to 70%, and more preferably from 0.05 to 30% by weight of the solution. The aqueous acidic discoloring solution based on an organic acid preferably has a concentration of from 0.1 to 70%, more preferably from 0.5 to 30%, and most preferably from 2 to 10% by weight of the solution.

For photosensitive layer having a visible dye capable of changing color (preferably turning off color) or a latent dye capable of turning on color upon contact with a base, an alkaline aqueous solution can be used as the discoloring solution. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. More preferred amines are organic amines, including polymeric amines. Suitable water-soluble amines include regular amine compounds such as triethylamine, triethanolamine, 2-amino-2-methyl-1-propanol, tris(hydroxymethyl)aminomethane and N-methyl-2-pyrrolidone, and polymeric amines such as polyethyleneamine. The alkaline compound is preferably applied as an aqueous solution to discolor the photosensitive layer. When strong base (such as sodium hydroxide) is used as discoloring agent, it is preferably diluted to low concentration (such as less than 0.5%, preferably less than 0.1% by weight) in an aqueous solution so that it does not damage the plate or cause safety problem. The alkaline discoloring solution preferably has a pH of from 8 to 13.5, more preferably from 8.5 to 12.0, and most preferably from 9.0 to 11.0. The alkaline discoloring solution preferably has a concentration of from 0.01 to 70%, and more preferably from 0.05 to 30% by weight of the solution. The aqueous alkaline discoloring solution based on an organic amine preferably has a concentration of from 0.1 to 70%, more preferably from 0.5 to 30%, and most preferably from 2 to 10% by weight of the solution.

For a photosensitive layer comprising a dispersed pigment, the discoloring solution can be any aqueous solution capable of causing flocculation of the dispersed pigment primarily or only in the non-hardened areas. Such a discoloring solution is also called flocculating solution. Here the term flocculation means becoming non-dispersed, aggregated, or insolubilized from a dispersed or solubilized system. Preferably, the flocculating solution is an aqueous solution (including blend of water and an organic solvent) capable of causing flocculation (or aggregation) of the dispersed pigment in the photosensitive layer upon diffusing into it and capable of diffusing into the non-hardened areas of the photosensitive layer more efficiently than into the hardened areas. More preferably, the flocculating solution diffuses into the photosensitive layer in the non-hardened areas to flocculate the pigment without completely dissolving the photosensitive layer so that the photosensitive layer in the non-hardened areas does not flow around. Any pigment can be used, including organic pigment such as copper phthalocyanine and other phthalocyanine pigments, and inorganic pigment such as iron oxide and copper carbonate. The pigment is dispersed as fine particles in the photosensitive layer, usually with certain pigment dispersant or polymer, so as to have good color strength. The flocculating solution is preferably capable of swelling (without completely dissolving) the photosensitive layer in the non-hardened areas but incompatible with (causing flocculation of) the pigment dispersion. A compound capable of causing or helping the flocculation (such as by physical interaction or chemical reaction with the dispersant) can be used in the flocculating solution.

For a photosensitive layer comprising a visible dye capable of flocculation, the discoloring solution (also called flocculating solution here) can be any aqueous solution capable of causing flocculation of such dye primarily or only in the non-hardened areas. The visible dye is insoluble in the non-hardened photosensitive layer soaked with such flocculating solution and is capable of flocculating into less or different colored (preferably less colored) aggregates in the photosensitive layer. Preferably, the flocculating solution is capable of causing flocculation of the visible dye in the photosensitive layer upon diffusing into it and capable of diffusing into the non-hardened areas of the photosensitive layer more efficiently than into the hardened areas. More preferably, the flocculating solution is capable of diffusing into the photosensitive layer in the non-hardened areas without completely dissolving the photosensitive layer so that the photosensitive layer in the non-hardened areas does not flow around.

The hydrophilizing agent can be any water-soluble compound capable of enhancing the hydrophilicity of the substrate. Preferably, such hydrophilizing agent is an acid or base, more preferably an acid. Suitable acid compounds include organic compounds with at least one carboxylic acid groups, polymers with phosphonic acid groups, and phosphoric acid. Particularly suitable acid compounds include citric acid, acetic acid, salicylic acid, glycolic acid, malic acid, lactic acid, phosphoric acid, and polyvinyl phosphonic acid. The hydrophilizing agent is preferably dissolved in water and/or an organic solvent, more preferably in water, to form a hydrophilizing solution for applying to the plate.

The development enhancer can be any water soluble compound capable of enhancing the developability of the photosensitive layer in ink and/or fountain solution. Preferably, such development enhancer is an organic compound capable of enhancing the developability of the photosensitive layer in ink and/or fountain solution. More preferably, such development enhancer is a liquid organic compound capable softening the photosensitive layer. The water soluble liquid organic compound suitable as development enhancer preferably has a boiling point of at least 150° C., more preferably at least 200° C., and most preferably at least 250° C. Suitable development enhancers include, for example, polyethylene glycol, glycerin, methoxypropanol, diethyleneglycol, triethyleneglycol, and various nonionic surfactants. The development enhancer is dissolved in water to form a development enhancing solution for applying to the plate. Preferably, the application of the development enhancer increases the ease of developing the plate, so that the roll up impressions (the number of rotations of the plate cylinder between engaging the inking roller and completely cleaning up the background of the plate) is reduced by at least 5 impressions, more preferably at least 10 impressions, and most preferably at least 20 impressions due to the application of the development enhancer. For example, for an untreated plate originally requiring 30 roll up impressions (of the rotations of the plate cylinder of a lithographic press) to achieve clean background, the same plate treated with a development enhancer only requires at most 25 roll up impressions (preferably at most 20 impressions, more preferably at most 10 impressions) to achieve clean background.

The aqueous solution suitable for this invention can be any aqueous solution capable of removing the overcoat without causing adverse effect to the plate. Preferably, the aqueous solution is capable of enhancing a certain aspect of the performance of the plate. More preferably, the aqueous solution is capable of enhancing more than one aspects of the performance of the imagewise exposed plate, such as enhancing both the white light stability (by deactivating the photosensitive layer) and the visible image contrast (by discoloration primarily or only in the non-hardened areas). Most preferably, the aqueous solution is capable of enhancing the white light stability (by deactivation), the image contrast (by discoloration primarily or only in the non-hardened areas), the hydrophilicity of the substrate, and the developability of the photosensitive layer. The aqueous solution capable of two or more functions (such as both deactivation and discoloration) can comprise 2 separate components (such as a deactivating agent and a discoloring agent), can comprise the same component capable of both functions (such as a deactivating agent which is also a discoloring agent), or can comprise both a component with two or more functions and a component with only single function. Preferably, the aqueous solution comprises at least one component which is capable of two or more functions (such as both deactivating the photosensitive layer and hydrophilizating the substrate). Examples of multifunctional components include an acid compound (such as citric acid, applied from an aqueous solution) which is capable of deactivation, discoloration, and hydrophilization for certain plates. Examples of single-functional components include a water soluble organic solvent (such as triethyleneglycol, applied from an aqueous solution) which is capable of enhancing the on-press developability of the photosensitive layer.

The rinsing of a laser exposed plate with water or an aqueous solution is preferably performed on a rinsing device (which is a type of overcoat removal devices of this application). More preferably, the plate is transported through the rinsing device to contact with water or an aqueous solution. The rinsing device preferably further comprises a drying unit (such as a pair of squeegee rollers, forced air, heater, or a pair of squeegee rollers followed by forced hot air) to dry off the liquid on the plate surface. The rinsing device can be a separate device from the exposure device, or can be connected to or be part of the exposure device. Preferably, the rinsing device is connected to or is part of the exposure device.

The plate rinsed with water or an aqueous solution is preferably further dried to remove at least some of the water from the aqueous solution (which has been applied to the plate). More preferably the plate is dried so that the plate surface is at least free of overflowing liquid. Most preferably, the plate is dried so that the plate surface is free of any wet-looking liquid layer. The rinsed plate can be dried by any means, such as squeegee rollers, forced air, heater, or rubber blade. Preferably, the rinsed plate is dried with squeegee rollers, forced hot air, or squeegee rollers followed by forced air. More preferably, the rinsed plate is dried by forced hot air. Most preferably, the rinsed plate is dried by a pair of squeegee rollers followed by forced hot air.

The plate stripped off overcoat (by mechanical peeling or by rinsing with water or an aqueous solution) may be further overall exposed with a second radiation to, for example, further enhance the visible image or give a different-colored visible image and/or to cause further crosslinking of the photosensitive layer in the hardened areas, without causing hardening of the non-hardened areas, before on-press development. The radiation for the overall exposure can be applied with any exposure method which delivers radiation to the whole photosensitive layer; preferably from a lamp on an exposure device or on a treating device (by passing through it); more preferably by passing through a radiation from a lamp on a treating device. Here the radiation as applied is incapable of causing hardening of the particular photosensitive layer without overcoat.

The plate stripped off overcoat may be further overall heated to, for example, further enhance the visible image or give a different-colored visible image and/or to cause further crosslinking of the hardened areas of the photosensitive layer, before on-press development. The heating can be applied through any means, such as hot plate, oven, passing-through heater, radiation heater, and hot air heater. Preferably, the plate is passed through a heater having radiation or hot air. More preferably, the plate is passed through a heater which is part of or connected to an overcoat removing device.

The laser imaged plate may be overall heated to an elevated temperature before removing the overcoat. Such a heating is called preheat, and may be utilized to cause further crosslinking of the hardened areas of the photosensitive layer. The heating can be applied through any means, such as hot plate, oven, passing-through heater, radiation heater (with a radiation which does not cause hardening of the photosensitive layer in the non-hardened areas), and hot air heater. Preferably, the plate is passed through a heater having radiation or hot air. More preferably, the plate is passed through a heater which is part of or connected to the laser imager.

For plate which is stripped off the overcoat by mechanical peeling, or by rinse with water or an aqueous solution followed by drying with forced air or heat to remove any wet surface, the laser imaged and overcoat-removed plate can he directly mounted on press for development with ink and/or fountain solution, or can be stacked together with other dried plates before mounting on-press for development. Preferably, more than one plates are stacked together, and then picked up by the operator to mount on press for development with ink and/or fountain solution and lithographic printing.

The plate of the instant invention (with overcoat) can be supplied as sheets or roll, preferably as stack of sheets. The plate sheets or roll may or may not have interleafing paper in between the plates. Preferably, the overcoat is durable and non-tacky enough so that no interleaving paper is required between plates when supplied. This will simplify the handling of the plate, especially during mechanical feeding of the plate to the laser imager. Because the overcoat does not need to be removed on press by the instant invention, it allows the opportunity to easily design an overcoat which is durable and non-tacky enough suitable for handling without the use of interleafing paper; preferably, such an overcoat is incapable of removal after contacting with ink and/or fountain solution on press for up to 200 rotations of the plate cylinder.

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric film support. A surface coating may be coated to achieve desired surface properties. For wet plate, the substrate should have a hydrophilic or oleophilic surface, depending on the surface properties of the photosensitive layer (preferably with opposite philicity to the substrate); more preferably, a wet lithographic plate has a hydrophilic substrate and an oleophilic photosensitive layer. For waterless plate, the substrate should have an oleophilic or oleophobic surface, depending on the surface properties of the photosensitive layer (preferably with opposite philicity to the substrate).

Particularly suitable hydrophilic substrate for a wet lithographic plate is an aluminum support that has been grained and anodized; such a substrate is preferably further deposited with a hydrophilic barrier layer. Surface graining can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer that is crosslinked, as described in U.S. Pat. No. 5,922,502.

For the plate of this application, at least the hardened areas of the photosensitive layer exhibit an affinity or aversion substantially opposite to the affinity or aversion of the substrate to at least one printing liquid selected from the group consisting of ink and an adhesive fluid for ink (including both plates with non-phase-switchable photosensitive layer and plates with phase-switchable photosensitive layer). Preferably, the photosensitive layer exhibits an affinity or aversion substantially opposite to the affinity or aversion of the substrate to at least one printing liquid selected from the group consisting of ink and an adhesive fluid for ink (as for plates with non-phase-switchable photosensitive layer, which can be wet plate or waterless plate). More preferably, the plate has a hydrophilic substrate and an oleophilic photosensitive layer (as for wet plate with non-phase-switchable photosensitive layer). An adhesive fluid for ink is a fluid that repels ink. Fountain solution is the most commonly used adhesive fluid for ink. A wet plate is printed on a wet press equipped with both ink and fountain solution, while a waterless plate is printed on a waterless press equipped with ink.

Usually, as for most printing plates described in the literature, the photosensitive layer exhibits an affinity or aversion substantially opposite to the affinity or aversion of the substrate to at least one printing liquid selected from the group consisting of ink and an adhesive fluid for ink, and does not switch its affinity or aversion upon laser exposure. However, certain photosensitive layer exhibits substantially the same affinity or aversion as the substrate and is capable of switching to opposite affinity or aversion upon exposure to a laser (with or without further treatment such as on-press development with ink and/or fountain solution), as described in U.S. Pat. Nos. 6,331,375, 5,910,395, 6,720,464, and 6,136,503. Both non-phase-switchable photosensitive layer and phase-switchable photosensitive layer can be used for the current invention. Preferred is a non-phase-switchable photosensitive layer (coated on a substrate with opposite affinity or aversion). More preferred is an oleophilic photosensitive layer (coated on a hydrophilic substrate).

In this patent, the term color change or the term discoloration means any change on the appearance of the color, such as changing to a different color (such as from blue to green), increasing in color strength (such as becoming bluer), decreasing in color strength (such as becoming less blue), turning off of a color (such as with a blue color completely disappearing), or formation (turning on) of a color (such as from colorless to blue). The term yellow or red light means yellow light, red light, or any light with a color between yellow and red such as orange light. The term safe light means a light with a certain wavelength range being cut off, including a yellow light or red light, so that it does not cause hardening of a certain photosensitive layer. The term white light means a white fluorescent light, a white incandescent light, sunlight, or any white office light. The term white room light means a typical white office light (with white fluorescent light). The term substantially no radiation below a wavelength means the intensity of the radiation below that wavelength is less than 1% of that for a regular 100-watt incandescent light (for home use, not focused) at a distance of 2 meters. The term substantial darkness means the intensity of the radiation is less than 1% of that for a regular 100-watt incandescent light at a distance of 2 meters. The term substantially light-tight means less than 1% of the room light can pass through. The term substantially all means at least 99%. The term "with the plate under a room light" means the plate is exposed to such room light; i.e., such room light reaches the plate. The term monomer includes both polymerizable monomer and polymerizable oligomer. The term (meth)acrylate includes acrylate and/or methacrylate (acrylate, methacrylate, or both acrylate and methacrylate).

For preparing lithographic printing plates of the current invention, any photosensitive layer is suitable which is soluble or dispersible in ink and/or fountain solution, and is capable of hardening upon exposure to a laser having a wavelength selected from 200 to 1200 nm. Here hardening means becoming insoluble and non-dispersible in ink and/or fountain solution. Hardening is generally achieved through crosslinking or polymerization of the resins (polymers or monomers). A laser sensitive dye or pigment (preferably a sensitizing dye) is preferably added in the photosensitive layer. The photosensitive layer preferably has a coverage of from 100 to 3000 mg/m$^2$, more preferably from 200 to 2000 mg/m$^2$, and most preferably from 400 to 1500 mg/m$^2$.

Preferably, the photosensitive layer comprises a polymerizable monomer and an initiating system, optionally with addition of a polymeric binder. The initiating system generally comprises an initiator; an initiator and a sensitizing dye; or an initiator, a sensitizing dye and a hydrogen donor; depending on the specific photosensitive layer. Either one species (such as 1 initiator or 1 polymer) or more than one species of the same component type (such as 2 different initiators or 3 different monomers) can be added in the same photosensitive layer. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the photosensitive layer dispersible with ink and fountain solution, or emulsion of ink and fountain solution. Various additives useful for conventional photosensitive layer can also be used. These additives include pigment, dye, exposure indicator, and stabilizer.

Photosensitive materials useful in wet plates of this invention include, for example, photosensitive compositions comprising a polymerizable monomer, an initiator, a sensitizing dye, and optionally a polymeric binder.

Photosensitive oleophobic materials useful in waterless plates of this invention include, for example, compositions comprising a monomer having perfluoroalkyl or polysiloxane groups and crosslinkable terminal groups, an initiator, and a sensitizing dye.

Infrared laser sensitive (also called thermosensitive) materials useful for wet lithographic plates of this invention include, for example, thermosensitive compositions comprising a polymerizable monomer, an initiator, an infrared absorbing dye, and optionally a polymeric binder.

Visible or ultraviolet light sensitive materials useful for wet plates of this invention include, for example, photosensitive compositions comprising a polymerizable monomer, an initiator, a visible or ultraviolet light sensitizing dye, and optionally a polymeric binder. A hydrogen donor is preferably added to accelerate the polymerization.

Polymeric binder for the photosensitive layer of this invention can be any solid film-forming polymer. Such polymer may or may not have (meth)acrylate groups or other ethylenic groups (such as allyl groups). Examples of suitable polymeric binders include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, polyurethane binder, and polymeric binder having polymer backbone with recurring units having pendant poly(alkylene glycol) side chains. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with polymerizable groups) in this application (oligomers having polymerizable groups are also included in the definition of monomers in this application).

Suitable free-radical polymerizable monomers include any monomer or oligomer with at least one ethylenically unsaturated group. Such monomers include monofunctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth)acrylate; oligomeric amine (meth)acrylate; and phosphate ester-containing (meth)acrylate (such as phosphate ester of 2-hydroxyethyl methacrylate, and various phosphate ester containing (meth)acrylate monomers as described in U.S. Pat. Nos. 4,101,326, 5,679,485, 5,776,655 and 7,316,887, and U.S. Pat. App. No. 2008/0008957). The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (metha)acrylate monomers are those with at least 3 (meth)acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri (meth)acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth) acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa (meth)acrylate, di(trimethylolpropane) tetra(meth)acrylate. Among the non-urethane (meth)acrylate monomers, non-urethane acrylate monomer is preferred.

Suitable free-radical initiators include, for example, the derivatives of acetophenone (such as 2,2-dimethoxy-2-phenylacetophenone and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl)triaryl phosphonium hexafluoroantimonate and N-ethoxy(2-methyl)pyridinium hexafluorophosphate, and the onium salts as described in U.S. Pat. Nos. 5,955,238, 6,037,098 and 5,629, 354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis (trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene compounds such as bis($\eta^9$-2,4-cyclopentadien-1-yl) bis[2,6-difluoro-3-(1H-pyrrol-1-yl)phenyl)titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4', 5,5'-tetraphenyl-1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are preferred initiators for infrared laser sensitive plate. Titanocene compounds and hexaarylbiimidazole compounds are preferred initiators for visible or ultraviolet laser sensitive plate, and hexaarylbiimidazole compounds are more preferred. The initiator is added in the photosensitive layer preferably at 0.1 to 40% by weight of the photosensitive layer, more preferably 1 to 30%, and most preferably 5 to 20%.

Suitable sensitizing dyes in this invention include any compounds capable of absorbing an imaging radiation and transferring the absorbed radiation energy to the initiator or other component in the photosensitive layer to cause hardening of the photosensitive layer. Suitable sensitizing dyes include infrared sensitizing dyes (also called infrared absorbing dyes), visible sensitizing dyes (including violet sensitizing dyes), and ultraviolet sensitizing dyes. Preferred are infrared absorbing dyes and violet or ultraviolet sensitizing dyes. More preferred are infrared laser absorbing dyes and violet or ultraviolet laser sensitizing dyes.

Infrared sensitizing dyes useful in the thermosensitive layer of this invention include any infrared absorbing dye effectively absorbing an infrared radiation having a wavelength of 750 to 1200 nm. It is preferable that the dye has an absorption maximum between the wavelengths of 780 and 1100 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared laser sensitizing dye is added in the photosensitive layer preferably at 0.1 to 20% by weight of the photosensitive layer, more preferably 0.5 to 10%, and most preferably 1 to 5%.

Visible or ultraviolet sensitizing dyes useful in the visible or ultraviolet sensitive photosensitive layer of this invention include any dyes having a wavelength maximum of from 200 to 600 nm. Suitable visible or ultraviolet sensitizing dyes include, for example, cyanine dyes; rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5- bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl)pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet laser sensitizing dye is added in the photosensitive layer preferably at 0.1 to 20% by weight of the photosensitive layer, more preferably 0.5 to 15%, and most preferably 1 to 10%.

The free radical polymerizable photosensitive composition of the present invention can contain one or more hydrogen donors as polymerization accelerator. Examples of the hydrogen donors include compounds having a mercapto group (also called mercapto compounds) such as 2-mercaptobenzoxazole, 2-mercaptobenzothiazole, 2-mercaptobenzimidazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are mercapto compounds and N-aryl-α-amino acids, their salts and esters; more preferred are mercapto compounds. Combination of at least one mercapto compound and at least one N-aryl-α-amino acid or its ester or salt can be advantageously used in the photosensitive layer. The hydrogen donor is preferably added in the photosensitive layer at 0.01 to 15% by weight of the photosensitive layer, more preferably 0.1 to 10%, and most preferably 0.5 to 5%.

Various surfactants can be added into the photosensitive layer to allow or enhance the on-press developability with ink and/or fountain. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

A hydrophilic or oleophilic micro particles may be added into the photosensitive layer to enhance, for example, the on-press developability and non-tackiness. Suitable micro particles include polymer particles, talc, titanium dioxide, barium sulfate, silicone oxide, and aluminum micro particles, with an average particle size of less than 10 microns, preferably less than 5 microns, more preferably less than 2 microns, and most preferably less than 1 micron. A suitable particular dispersion is described in U.S. Pat. No. 6,071,675, the entire disclosure of which is hereby incorporated by reference.

For plates with rough and/or porous surface capable of mechanical interlocking with a coating deposited thereon, a thin water-soluble interlayer may be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The water-soluble organic solvent is preferably added at less than 20% by weight of the solution, more preferably at less than 10%. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The photosensitive layer may be conformally coated onto a roughened substrate (for example, with Ra of larger than 0.4 microns) at thin coverage (for example, of less than 1.2 g/m$^2$) so that the plate can have microscopic peaks and valleys on the photosensitive layer coated surface, and exhibit low tackiness and good block resistance (before coating overcoat during manufacture or after removing overcoat before mounting on press), as described in U.S. Pat. No. 6,242,156, the entire disclosure of which is hereby incorporated by reference.

In a preferred embodiment for the thermosensitive lithographic printing plate of this invention, the thermosensitive layer comprises a polymeric binder, a polymerizable monomer having at least one terminal ethylenic group, a free-radical initiator, and an infrared absorbing dye. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The weight ratio of all the monomers to all the polymeric binders is preferably at least 1.0, more preferably from 1.5 to 6.0, and most preferably from 2.0 to 5.0.

In another preferred embodiment for the thermosensitive lithographic plates of this invention, the thermosensitive layer comprises a polymeric binder, a urethane (meth)acrylate monomer having at least 4 (meth)acrylate groups, a free-radical initiator, and an infrared absorbing dye. A mercapto group-containing compound is preferably added. The weight ratio of all the monomers to all the polymeric binders is preferably at least 1.0, more preferably from 1.5 to 6.0, and most preferably from 2.0 to 5.0.

In yet another preferred embodiment for the thermosensitive lithographic plates of this invention, the thermosensitive layer comprises a polymeric binder having polymer backbone with recurring units having pendant poly(alkylene glycol) side chains, a (meth)acrylate monomer having at least one (meth)acrylate group, a free-radical initiator, and an infrared absorbing dye. A mercapto group-containing compound is preferably added. The weight ratio of all the monomers to all the polymeric binders is preferably at least 1.0, more preferably from 1.5 to 6.0, and most preferably from 2.0 to 5.0.

In further another preferred embodiment for the thermosensitive lithographic plates of this invention, the thermosensitive layer comprises a polymeric binder, a urethane (meth)acrylate monomer having at least 4 (meth)acrylate groups, a phosphate ester-containing (meth)acrylate monomer, a free-radical initiator, and an infrared absorbing dye. A mercapto group-containing compound is preferably added. The weight ratio of all the monomers to all the polymeric binders is preferably at least 1.0, more preferably from 1.5 to 6.0, and most preferably from 2.0 to 5.0.

In yet further another preferred embodiment for the thermosensitive lithographic plates of this invention, the thermosensitive layer comprises a polymeric binder, a urethane (meth)acrylate monomer having at least 4 (meth)acrylate groups, a non-urethane (meth)acrylate monomer having at least 4 (meth)acrylate groups, a free-radical initiator, and an infrared absorbing dye. The weight ratio of all the monomers to all the polymeric binders is preferably at least 1.0, more preferably from 1.5 to 6.0, and most preferably from 2.0 to 5.0.

In a preferred embodiment for visible light sensitive lithographic printing plates of this invention, the photosensitive layer comprises a polymeric binder, a polymerizable monomer having at least one terminal ethylenic group, a free-radical initiator, and a visible sensitizing dye. A hydrogen donor is preferably added. Other additives such as surfactant, dye or pigment, exposure-indicating dye, and free-radical stabilizer may be added. The weight ratio of all the monomers to all the polymeric binders is preferably at least 1.0, more preferably from 1.5 to 6.0, and most preferably from 2.0 to 5.0.

In a preferred embodiment for violet or ultraviolet light sensitive lithographic printing plates of this invention, the photosensitive layer comprises a polymeric binder, a polymerizable monomer having at least one terminal ethylenic group, a free-radical initiator, and a violet or ultraviolet sensitizing dye. A hydrogen donor is preferably added. Other additives such as surfactant, dye or pigment, exposure-indicating dye, and free-radical stabilizer may be added. The weight ratio of all the monomers to all the polymeric binders is preferably at least 1.0, more preferably from 1.5 to 6.0, and most preferably from 2.0 to 5.0.

In another preferred embodiment for the violet or ultraviolet laser sensitive lithographic plates of this invention, the photosensitive layer comprises a polymeric binder, a monomer having at least 3 (meth)acrylate group, a hexaarylbiimidazole or titanocene compound, and a dialkylaminobenzophenone compound. A mercapto group-containing compound is preferably added. The weight ratio of all the monomers to all the polymeric binders is preferably at least 1.0, more preferably from 1.5 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound.

In yet another preferred embodiment for the violet or ultraviolet laser sensitive lithographic plates of this invention, the photosensitive layer comprises a polymeric binder, a urethane monomer having at least 4 (meth)acrylate groups, a hexaarylbiimidazole or titanocene compound, and a dialkylaminobenzophenone compound. A mercapto group-containing compound is preferably added. The weight ratio of all the monomers to all the polymeric binders is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane (meth)acrylate monomer is preferably added.

In further another preferred embodiment for the violet or ultraviolet laser sensitive lithographic plates of this invention, the photosensitive layer comprises a polymeric binder, a urethane monomer having at least 4 (meth)acrylate groups, a non-urethane monomer having at least 4 (meth)acrylate groups, a free radical initiator, and a violet or ultraviolet sensitizing dye. A mercapto group-containing compound is preferably added. The weight ratio of the urethane (meth)acrylate monomer to the non-urethane (meth)acrylate monomer is preferably from 0.10 to 10.0, more preferably from 0.20 to 5.0, and most preferably from 0.30 to 3.0. The weight ratio of all the monomers to all the polymeric binders is preferably at least 0.5, more preferably from 1.0 to 6.0, even more preferably from 1.5 to 5.0, and most preferably from 2.0 to 4.0. A preferred free radical initiator is a hexaarylbiimidazole or titanocene compound, more preferably a hexaarylbiimidazole compound. A preferred sensitizing dye is a dialkylaminobenzophenone compound, more preferably a 4,4'-bis(dialkylamino)benzophenone compound.

In yet further another preferred embodiment for the violet or ultraviolet laser sensitive lithographic plates of this invention, the photosensitive layer comprises a polymeric binder having polymer backbone with recurring units having pendant poly(alkylene glycol) side chains, a (meth)acrylate monomer having at least one (meth)acrylate group, a free-radical initiator, and a violet or ultraviolet sensitizing dye. A mercapto group-containing compound is preferably added. Other additives such as surfactant, dye or pigment, exposure-indicating dye, and free-radical stabilizer may be added. The weight ratio of all the monomers to all the polymeric binders is preferably at least 1.0, more preferably from 1.5 to 6.0, and most preferably from 2.0 to 5.0.

In also further another preferred embodiment for the violet or ultraviolet laser sensitive lithographic plates of this invention, the photosensitive layer comprises a polymeric binder, a urethane monomer having at least 4 (meth)acrylate groups, a phosphate ester-containing (meth)acrylate monomer, a free radical initiator, and a violet or ultraviolet sensitizing dye. A mercapto group-containing compound is preferably added. The weight ratio of all the monomers to all the polymeric binders is preferably at least 0.5, more preferably from 1.0 to 6.0, and most preferably from 2.0 to 5.0. A preferred free radical initiator is a hexaarylbiimidazole or titanocene compound, more preferably a hexaarylbiimidazole compound. A preferred sensitizing dye is a dialkylaminobenzophenone compound, more preferably a 4,4'-bis(dialkylamino)benzophenone compound. A phosphate-free non-urethane (meth)acrylate monomer can be added.

For preparing lithographic printing plate capable of discoloration selectively in the non-hardened area with a discoloring solution (preferably an aqueous rinsing solution containing a discoloring agent), the above plates preferably further comprise a visible dye, a dispersed pigment, or a latent dye in the photosensitive layer.

The overcoated on-press developable lithographic plates as described in U.S. Pat. Nos. 6,482,571, 6,576,401, 5,548,222 and 6,541,183, and U.S. patent application Ser. Nos. 10/720,882, 11/075,663, 11/175,518, 11/266,817, 11/356,911, 11/728,648, 11/787,878, 11/800,634, 11/810,710, 11/825,576, 11/859,756, 11/944,204, 11/967,961, and 12/030,867, the entire disclosures of which are hereby incorporated by reference, can be used for the instant invention.

The laser for the imagewise exposure in this application can be any laser having a wavelength selected from 200 to 1200 nm which is capable of causing hardening to the photosensitive layer, preferably a violet or ultraviolet laser of from 200 to 430 nm or an infrared laser of 750 to 1200 nm.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diode emitting around 830 nm or NdYAG laser emitting around 1060 nm. The plate is exposed at a laser dosage that is sufficient to cause hardening in the exposed areas but not high enough to cause substantial thermal ablation. The exposure dosage is preferably from 1 to 500 mJ/cm$^2$, more preferably from 5 to 200 mJ/cm$^2$, and most preferably from 20 to 150 mJ/cm$^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 390 to 430 nm), and visible LEDs. Violet laser diode is especially useful because of its small size and relatively low cost. The exposure dosage is preferably from 0.0001 to 5 mJ/cm$^2$ (0.1 to 5000 µJ/cm$^2$), more preferably from 0.001 to 0.5 mJ/cm$^2$ (1 to about 500 µJ/cm$^2$), and most preferably from 0.005 to 0.10 mJ/cm$^2$ (5 to 100 µJ/cm$^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.0001 to 5 mJ/cm$^2$ (0.1 to 5000 µJ/cm$^2$), more preferably from 0.001 to 0.5 mJ/cm$^2$ (1 to about 500 µJ/cm$^2$), and most preferably from 0.005 to 0.10 mJ/cm$^2$ (5 to 100 µJ/cm$^2$), depending on the sensitivity of the photosensitive layer.

Among the visible and ultraviolet lasers, particularly useful is violet or ultraviolet laser with a wavelength selected from 200 to 430 nm, preferably from 300 to 430 nm.

Laser imaging devices are currently widely available commercially. Any device can be used which provides laser exposure to the plate according to digital imaging information. Commonly used imaging devices include flatbed imager, internal drum imager, and external drum imager, all of which can be used for the imagewise laser exposure in this invention.

The plate can be exposed with a laser on an laser imager, stripped off the overcoat (preferably on a overcoat removing device, which can be standalone or can be connected to or part of the laser imager, preferably connected to or part of the laser imager), and then mounted on press to develop with ink and/or fountain solution and then print out regular printed sheets. The ink and/or fountain solution solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium. Good quality prints should be obtained preferably under 40 initial impressions, more preferably under 20 impressions, and most preferably under 5 impressions.

It is noted that for a good quality print, the imaged areas should have good inking and the background areas should be free of ink (with clean background). Any background toning is not desirable.

The term "background toning" means that the non-imaged areas (with photosensitive layer removed from the substrate during development) of the developed plate, as well as the non-imaged areas of the printed sheets, accept small amount of ink and are not completely clean, so that the non-imaged areas of a printed paper shows slightly different color (such as slightly gray for a white paper with background toning when printed with black ink, or slightly pink for a white paper with background toning when printed with red ink). Background toning is usually caused by partial curing of the photosensitive layer, incomplete removal of the photosensitive layer during development, insufficient hydrophilicity of the substrate, or insufficient fountain solution level of the press. A plate of this invention which is originally free of background toning can become having background toning after exposure to a white room light for a certain amount of time due to partial curing of the photosensitive layer; further exposure to such white room light may, or may not, lead to full hardening of the photosensitive layer, depending on the particular plate. In normal printing operation as well as in this application, sufficient fountain solution level on press should be maintained, so that the background toning should not be caused by insufficient fountain solution level.

It is noted that some negative plate will become having background toning after exposure to white room light for a certain amount of time and become fully hardened after further exposure to white room light, some negative plate will become having background toning after exposure to white room light for a certain amount of time but will never become fully hardened with further exposure to white room light, some negative plate will become fully hardened under white room light quickly (such as under 10 minutes), and some negative plate will never become fully hardened or having background toning even after exposure to white room light for a long period of time (such as at least 24 hours). Here the term "fully hardened" means that the photosensitive layer in specific areas is sufficiently cured so that substantially the whole photosensitive layer in such areas remains on the plate after development. The plates suitable for the instant invention are capable of hardening or background toning under a white room light for a limited time period (preferably less than a time period selected from 1 to 60 minutes) before the removal of the overcoat and are incapable of hardening or causing background toning under said white room light for at least twice of said time period after the removal of the overcoat.

During on-press development, ink and fountain solution may be applied to the plate on a lithographic press at any combination or sequence, as needed for the plate. For conventional wet press, preferably fountain solution roller is contacted to the plate first, followed by contacting with ink roller. For press with integrated inking/dampening system, preferably the ink and fountain solution are emulsified by various press rollers before being transferred to the plate as emulsion of ink and fountain solution.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in wet lithographic printing press to dampen the hydrophilic areas (non-image areas), repelling ink (which is hydrophobic and oleophilic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the photosensitive layer. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

After removing the overcoat and before mounting on press for development with ink and/or fountain solution, the plate is preferably inspected by the operator under white room light. Such inspection is to visually check any printout (visible images) such as colored printout or patterns of different refractive index of the photosensitive layer in the laser imaged areas, in order to ensure that the plate has been imaged and to identify the specific plates (with specific image patterns). The imaged and overcoat-removed plate preferably has printout which is colored printout or patterns of different refractive index of the photosensitive layer in the laser imaged areas, more preferably colored printout.

The imagewise laser exposure and the overcoat removal of this invention can be performed with the plate under any lightings (including darkness) at least for certain amount of time, as long as the exposure to such lightings for such amount of time will not cause hardening of the photosensitive layer; such lighting can be a yellow or red light (for preferably limited time, more preferably less than 120 minutes, and most preferably less than 30 minutes), darkness or substantial darkness, or white light (for limited time, preferably less than 60 minutes, and more preferably less than 20 minutes, and most preferably less than 5 minutes). Preferably, the laser exposure is performed with the plate under lightings (including darkness) that will not cause hardening of the photosensitive layer (even after long exposure); more preferably, under lightings containing no or substantially no radiation below a wavelength selected from 400 to 650 nm (such as 500 nm), or in darkness or substantial darkness; and most preferably under lightings containing no radiation below a wavelength selected from 400 to 650 nm, or in darkness. The lighting containing no or substantially no radiation below a wavelength selected from 400 to 650 nm (such as 500 nm) is usually a yellow or red light. This includes a light that is from a fluorescent or incandescent lamp covered with a filter that cuts off all or substantially all (at least 99%) of the radiation below a wavelength selected from 400 to 650 nm; preferably the lamp is covered with a filter that cuts off all of the radiation below a wavelength selected from 400 to 650 nm. The laser exposure and the overcoat removal can be performed with the plate under the same or different lightings.

The plate can be imagewise exposed on a laser imager and then stripped off the overcoat on an overcoat removal device. The imager and the overcoat removal device may stay open to the room light which is a white light (for limited time) or a yellow or red light (preferably for limited time), preferably a yellow or red light, depending on the sensitivity of the plate. Preferably, the laser imager and/or the overcoat removal device are covered with light-tight covers which are non-transparent or substantially non-transparent to the room light or are only transparent to yellow or red light, so that the plates are in darkness or substantial darkness or under yellow or red light while on the imager and/or the overcoat removal device. More preferably, both the imager and the overcoat removal device are covered with light-tight covers which are non-transparent or substantially non-transparent to the room light or are only transparent to yellow or red light. Even more preferably, both the imager and the overcoat removal device are covered with light-tight covers which consist of primarily non-transparent areas and small yellow or red light-passing-only areas; the small yellow or red light-passing-only areas allow monitoring the plate on the imager or overcoat removal device by the operator. Most preferably, both the imager and the overcoat removal device are covered with light-tight covers which are non-transparent to the room light, so that no or substantially no room light reaches the plate during imaging and overcoat removal.

The plate can be manually or automatically handled between the imager and the overcoat removal device. Preferably, the imager and the overcoat removal device are connected (either directly or through a transporting means for transporting the plate from the imager to the overcoat removal device) and the imaged plate is automatically transported from the imager to the overcoat removal device. Most preferably, the imaged plate is automatically transported from the imager to the overcoat removal device, and the imager, overcoat removal device, and the connection between them if not directly connected, are shielded with covers which prevent all or substantially all of the room light or of the below-450 nm portion of the room light from reaching the plate during imaging, transferring from the imager to the overcoat removal device, and overcoat removal.

The plate can be fed to the imager manually or automatically. Preferably, the plate is packaged in a light-tight or yellow or red light-passing-only cassette (including any form of covered structure which is capable of storing two or more plates and feeding one plate at a time) to automatically feed to the imager. More preferably, the plate is automatically fed from a light-tight cassette to the imager, and the imaged plate is automatically transferred to the overcoat removal device. Most preferably, the plate is automatically fed from a light-tight cassette to the imager, the imaged plate is automatically transferred to the overcoat removal device, and both the imager and the overcoat removal device are shielded with light-tight covers, so that the plate is shielded from the room light during the feeding to the imager, laser imaging, transferring from the imager to the overcoat removal device, and overcoat removal until the overcoat is removed; the room lighting is preferably a white light.

This invention is further illustrated by the following examples of its practice.

EXAMPLES 1-8

An electrochemically grained, anodized and polyvinyl phosphonic acid treated aluminum substrate was coated with a thermosensitive layer formulation PS-1 with a #6 Meyer rod, followed by drying in an oven at 100° C. for 2 min.

PS-1

| Component | Weight (g) |
|---|---|
| Neocryl B-728 (Polymer from Zeneca) | 2.50 |
| Ebecryl 220 (Acrylate monomer from UCB Chemicals) | 5.99 |
| Pluronic L43 (Nonionic surfactant from BASF) | 0.40 |
| (4-(2-Hydroxytetradecyl-oxy)phenyl)phenyliodonium hexafluorophosphate | 1.00 |
| PINA KF-1151 (Infrared absorbing polymethine dye from Allied Signal) | 0.10 |
| 2-Butanone | 90.00 |

The thermosensitive layer coated plate was further coated with a water-soluble overcoat OC-1 using a #6 Meyer rod, followed by hot air blow drying and baking in an oven at 100° C. for 2 min.

OC-1

| Component | Weight (g) |
|---|---|
| Airvol 203 (polyvinyl alcohol from Air Products) | 4.84 |
| Silwet 7604 (Surfactant from Union Carbide) | 0.02 |
| Triton X-100 (Surfactant from www.chemistrystore.com) | 0.14 |
| Water | 95.00 |

The coated plate was exposed with an infrared laser imager equipped with laser diodes emitting at about 830 nm (Trendsetter from Creo) at a dosage of about 200 mJ/cm$^2$. The exposed areas of the plate showed brown color, with the non-exposed areas remain light green. The exposed plate was cut into 8 pieces for further tests. Unless indicated otherwise, the plates were tested under a yellow light, and stored in a light-tight box between tests.

The 1$^{st}$ piece was stripped off the overcoat with a pressure sensitive adhesive tape (Scotch Brand packaging tape from 3M). The adhesive tape was taped to the coated side of the plate, and then pulled away from the plate. The overcoat in the taped areas came out with the tape and was removed from the plate. The same procedure was repeated for the rest areas of the plate, until the overcoat in the whole plate piece was removed. The 2$^{nd}$, 3$^{rd}$ and 4$^{th}$ pieces were stripped off the overcoat with the same procedure as for the 1$^{st}$ piece. The 5$^{th}$, 6$^{th}$, 7$^{th}$ and 8$^{th}$ pieces were not stripped.

The plate pieces were then exposed to an office white fluorescent light (total of 80 watts at about 2 meters) for various amounts of time as listed in Table 1, to test white light stability.

Each of the above plate pieces was tested on a wet lithographic press AB Dick 360. The press tests were performed under a white fluorescent light. Each plate was exposed to the white fluorescent light for about 5 minutes during the handling, mounting, and on-press development before being developed with ink and/or fountain solution The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 1.

TABLE 1

| | | Performance on AB Dick 360 lithographic press | | |
|---|---|---|---|---|
| Overcoat Stripping | Exposure time to white room light | Background at 20 impressions | Background at 200 impressions | Inking in imaging areas |
| Stripped | None | Clean | Clean | Good |
| Stripped | 30 minutes | Clean | Clean | Good |
| Stripped | 120 minutes | Clean | Clean | Good |
| Stripped | 300 minutes | Clean | Clean | Good |
| Non-stripped | None | Clean | Clean | Good |
| Non-stripped | 30 minutes | Slightly toning | Clean | Good |
| Non-stripped | 120 minutes | Toning | Toning | Good |
| Non-stripped | 300 minutes | Heavy toning | Heavy toning | Good |

EXAMPLES 9-14

The plate as prepared in EXAMPLES 1-8 was exposed with an infrared laser imager equipped with laser diodes emitting at about 830 nm (Trendsetter from Creo) at a dosage of about 200 mJ/cm$^2$. The exposed areas of the plate showed brown color, with the non-exposed areas remain light green. The exposed plate was cut into 6 pieces for further tests.

The first piece was dipped in a 10% by weight citric acid aqueous solution for 20 seconds. The second piece was dipped in a 10% by weight sodium chloride aqueous solution for 20 seconds. The third piece was dipped in a 0.2% by weight sodium hydroxide aqueous solution for 20 seconds. The fourth piece was dipped in a 10% by weight sodium xylenesulfonate aqueous solution for 20 seconds. The fifth piece was rinsed with water. All the above pieces of plate were dried by hot air blow to remove any excess water. The treatments were performed under yellow light. The sixth piece was not treated. All the above plate pieces were then exposed to an office white fluorescent light (total of 80 watts at about 2 meters) for 2 hours. The appearances of the plate pieces were listed in Table 2.

Each of the treated plates was tested on a wet lithographic press AB Dick 360 (under office white fluorescent light). The plate was directly mounted on the plate cylinder of the press.

After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 2.

TABLE 2

| Aqueous solution for treating plate | Appearance after laser exposure and treatment | | Performance on AB Dick 360 lithographic press | | |
|---|---|---|---|---|---|
| | Non-exposed areas | Laser exposed areas | Background at 20 impressions | Background at 200 impressions | Inking in imaging areas |
| 10% Citric acid | Light green | Brown | Clean | Clean | Good |
| 10% Sodium chloride | Light green | Brown | Clean | Clean | Good |
| 0.2% Sodium hydroxide | Light green | Light brown | Clean | Clean | Good |
| 10% Sodium xylenesulfonate | Light green | Light brown | Clean | Clean | Good |
| Rinse with water | Light green | Brown | Toning | Toning | Good |
| No treatment | Light green | Brown | Inked | Inked | Good |

EXAMPLE 15-18

An electrochemically roughened, anodized, and phosphate fluoride treated aluminum sheet was first coated with a 0.1% aqueous solution of polyvinyl alcohol (Airvol 540 from Air Products) with a #6 Meyer rod, followed by drying in an oven at 100° C. for 2 min. The polyvinyl alcohol coated substrate was further coated with the thermosensitive layer formulation PS-2 with a #6 Meyer rod, followed by hot air blow drying and baking in an oven at 100° C. for 2 min.

PS-2

| Component | Weight ratios |
|---|---|
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 2,4-Bis(trichloromethyl)-6-[(4-ethoxyethylenoxy)-phen-1-yl]-s-triazine | 1.00 |
| ADS-830AT (Infrared absorbing cyanine dye from American Dye Source) | 0.10 |
| Acetone | 90.0 |

The thermosensitive layer coated plate was further coated with a water-soluble overcoat OC-2 using a #18 Meyer rod, followed by hot air blow drying and baking in an oven at 100° C. for 2 min.

OC-2

| Component | Weight ratios |
|---|---|
| Airvol 205 (Polyvinyl alcohol from Air Products) | 10.0 |
| Triton X-100 (Surfactant from Union Carbide) | 0.20 |
| Water | 90.0 |

The plate was exposed with an infrared laser imager equipped with laser diodes emitting at about 830 nm (Trendsetter from Creo). The plate was mounted on the imaging drum and exposed at a laser dosage of about 300 mJ/cm². The exposed areas showed glossier but essentially colorless imaging pattern, in contrast to the less glossy non-imaged areas. The exposed plate was cut into 4 pieces for further tests. Unless indicated otherwise, the plates were tested under a yellow light, and stored in a light-tight box between tests.

The $1^{st}$ piece was stripped off the overcoat. A pressure sensitive adhesive tape (Scotch Brand packaging tape from 3M) was taped onto the overcoat of the plate on one end, and then gently pulled away. Substantially all the overcoat of the plate piece came off as one single film. The $2^{nd}$ and $3^{rd}$ pieces were stripped off the overcoat with the same procedure as the $1^{st}$ piece. The $4^{th}$ piece was not stripped.

The $2^{nd}$ and $3^{rd}$ plate pieces were then exposed to an office white fluorescent light (total of 80 watts at about 2 meters) for 30 and 120 minutes respectively. The $1^{st}$ and $4^{th}$ plate pieces were not exposed to the office white light. The plate was then tested on press for development with ink and fountain solution and for lithographic printing.

Each of the above plates was tested on a wet lithographic press AB Dick 360. The press tests were performed under a white fluorescent light. Each plate was exposed to the white fluorescent light for about 5 minutes during the handling, mounting, and on-press development before being developed with ink and/or fountain solution. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The $1^{st}$, $2^{nd}$ and $3^{rd}$ plate pieces (with overcoat stripped off) showed clean background under 20 impressions, good inking, and no wearing at 200 impressions. The $4^{th}$ plate piece (with overcoat not stripped) could not be developed on press, with the overcoat remaining on the plate after contacting with ink and fountain solution for 200 impressions.

I claim:

1. A method of lithographically printing images on a receiving medium, comprising in order:
   (a) providing a lithographic plate comprising (i) a substrate, (ii) a photosensitive layer, and (iii) an overcoat; said photosensitive layer being soluble or dispersible in ink and/or fountain solution and capable of hardening upon exposure to a laser having a wavelength selected from 200 to 1200 nm;
   (b) imagewise exposing said plate with said laser on a laser imager to cause hardening of said photosensitive layer in the exposed areas;
   (c) removing said overcoat from said plate;
   (d) mounting said plate on a lithographic press; and
   (e) contacting said plate with ink and/or fountain solution on said press to remove the photosensitive layer in the non-hardened areas and to lithographically print images from said plate to the receiving medium;

(f) wherein said steps (d) to (e) are performed with the plate under a white room light, said photosensitive layer before the removal of the overcoat is capable of hardening or causing background toning under said room light for less than a time period selected from 1 to 60 minutes, and said photosensitive layer after the removal of the overcoat is incapable of hardening or causing background toning under said room light for at least twice of said time period; wherein said overcoat is soluble or dispersible in water or an aqueous solution and is removed by rinsing with water or an aqueous solution, and said rinsed plate is dried with forced air before mounting on press.

2. The method of claim 1 wherein said photosensitive layer before the removal of the overcoat is capable of hardening or causing background toning under said room light for less than 60 minutes, and said photosensitive layer after the removal of the overcoat is incapable of hardening or causing background toning under said room light for at least 120 minutes.

3. The method of claim 1 wherein said photosensitive layer before the removal of the overcoat is capable of hardening or causing background toning under said room light for less than 30 minutes, and said photosensitive layer after the removal of the overcoat is incapable of hardening or causing background toning under said room light for at least 60 minutes.

4. The method of claim 1 wherein said photosensitive layer before the removal of the overcoat is capable of hardening or causing background toning under said room light for less than 10 minutes, and said photosensitive layer after the removal of the overcoat is incapable of hardening or causing background toning under said room light for at least 60 minutes.

5. The method of claim 1 wherein said photosensitive layer before the removal of the overcoat is capable of hardening or causing background toning under said room light for less than 1 minute, and said photosensitive layer after the removal of the overcoat is incapable of hardening or causing background toning under said room light for at least 60 minutes.

6. The method of claim 1 wherein the total exposure time of said plate to said room light in said steps (d) to (e) before the plate is developed is less than twice of said time period.

7. The method of claim 1 wherein said overcoat is soluble or dispersible in water and is removed by rinsing with water.

8. The method of claim 1 wherein said overcoat is soluble or dispersible in water and is removed by rinsing with an aqueous solution, and said aqueous solution contains a hydrophilizing agent and is capable of improving the hydrophilicity of the substrate.

9. The method of claim 1 wherein said plate is visually inspected by an operator under white room light after removing the overcoat and before mounting on press.

10. The method of claim 1 wherein said plate is stacked together with one or more other plates after overcoat removal and before mounting on press for development with ink and/or fountain solution.

11. The method of claim 1 wherein said overcoat has a coverage of at least 1.0 g/m$^2$.

12. The method of claim 1 wherein said overcoat is incapable of being completely removed with ink and/or fountain solution on said lithographic press after contacting with the ink roller and/or fountain solution roller for up to 200 rotations of the plate cylinder.

13. The method of claim 1 wherein said photosensitive layer comprises a polymeric binder, a free radical polymerizable monomer, a free radical initiator, and a sensitizing dye.

14. The method of claim 1 wherein said laser is a violet or ultraviolet laser having a wavelength selected from 200 to 430 nm.

15. The method of claim 1 wherein said laser is an infrared laser having a wavelength selected from 750 to 1200 nm.

16. The method of claim 1 wherein said steps (b) to (c) are performed with the plate under a yellow or red light, or in darkness or substantial darkness.

17. The method of claim 1 wherein said overcoat removal (step c) is performed on an overcoat removal device that is connected to or is part of an imaging device for said laser imaging (step b).

18. The method of claim 17 wherein both said imaging device and said overcoat removal device are shielded with covers which prevent at least 99% of room light from reaching said plate on said device.

19. A method of lithographically printing images on a receiving medium, comprising in order:

(a) providing a lithographic plate comprising (i) a hydrophilic substrate, (ii) an oleophilic photosensitive layer comprising a polymeric binder, a free radical polymerizable monomer, a free radical initiator, and a sensitizing dye, and (iii) an water soluble or dispersible overcoat; said photosensitive layer being soluble or dispersible in ink and/or fountain solution and capable of hardening upon exposure to a laser having a wavelength selected from 200 to 1200 nm;

(b) imagewise exposing said plate with said laser on a laser imager to cause hardening of said photosensitive layer in the exposed areas;

(c) removing said overcoat from said plate by rinsing with water or an aqueous solution;

(d) drying said rinsed plate with forced hot air;

(e) mounting said plate on a lithographic press; and (f) contacting said plate with ink and/or fountain solution on said press to remove the photosensitive layer in the non-hardened areas and to lithographically print images from said plate to the receiving medium;

(g) wherein said steps (e) to (f) are performed with the plate under a white room light, said photosensitive layer before the removal of the overcoat is capable of hardening or causing background toning under said room light for less than 30 minutes, and said photosensitive layer after the removal of the overcoat is incapable of hardening or causing background toning under said room light for at least 60 minutes.

* * * * *